(12) United States Patent
Hsu et al.

(10) Patent No.: US 8,729,632 B2
(45) Date of Patent: May 20, 2014

(54) SEMICONDUCTOR STRUCTURE WITH LOW RESISTANCE OF SUBSTRATE AND LOW POWER CONSUMPTION

(75) Inventors: Hsiu Wen Hsu, Hsinchu County (TW); Chih Cheng Hsieh, Taoyuan County (TW)

(73) Assignee: Niko Semiconductor Co., Ltd., New Taipei (TW)

( * ) Notice: Subject to any disclaimer, the term of this patent is extended or adjusted under 35 U.S.C. 154(b) by 18 days.

(21) Appl. No.: 13/305,771

(22) Filed: Nov. 29, 2011

(65) Prior Publication Data

US 2012/0193775 A1 Aug. 2, 2012

(30) Foreign Application Priority Data

Feb. 1, 2011 (TW) .............................. 100103795 A

(51) Int. Cl.
*H01L 27/12* (2006.01)
(52) U.S. Cl.
USPC ........... 257/350; 257/336; 257/296; 257/298; 257/138; 257/698; 257/E23.08

(58) Field of Classification Search
USPC ................. 257/336, 296, 298, 138, 350, 698, 257/E23.08
See application file for complete search history.

(56) References Cited

U.S. PATENT DOCUMENTS

| 7,799,602 | B2 * | 9/2010 | Pagaila et al. ................. 438/106 |
| 2010/0289092 | A1 * | 11/2010 | Perng et al. .................... 257/401 |
| 2011/0266683 | A1 * | 11/2011 | Feng ............................. 257/773 |
| 2012/0193775 | A1 * | 8/2012 | Hsu et al. ...................... 257/698 |

* cited by examiner

*Primary Examiner* — Elias M Ullah
(74) *Attorney, Agent, or Firm* — Li & Cai Intellectual Property (USA) Office

(57) ABSTRACT

A semiconductor structure comprising a semiconductor unit, a first conductive structure, a first conductive plug, and a second conductive structure is provided. The semiconductor unit has a substrate on a first side of the semiconductor unit. The substrate has at least a hole. The first conductive plug is in the hole and the hole may be full of the conductive plug. The first conductive structure is on the surface of the semiconductor unit. The surface is at the first side of the semiconductor unit. The second conductive structure is on a surface at a second side of the substrate of the semiconductor unit.

12 Claims, 7 Drawing Sheets

SEMICONDUCTOR STRUCTURE WITH LOW RESISTANCE OF SUBSTRATE AND LOW POWER CONSUMPTION

BACKGROUND OF THE INVENTION

1. Field of the Invention

The present invention relates to a semiconductor structure; in particular, to a semiconductor structure with low power consumption.

2. Description of Related Art

In applications of power metal-oxide semiconductors (power MOS), electrical specifications and heat dissipation capability are among the most critical. The primary factor that influence the electrical specifications and the heat dissipation capability of the power MOS is drain-source on-resistance Rds(ON), which generally consists of conducting resistance of the power MOS die and resistance formed in the packaging process of the power MOS. As it is well known that a minimized Rds(ON) corresponds to the superior heat dissipation capability and electrical specification of the power MOS, how to decrease both the conducting resistance and the resistance associated with the packaging has been one of challenges facing in the power MOS industry.

When a substrate 101 of a traditional vertical power MOS, shown in FIG. 1, takes up over 90% of the size of a power MOS chip in terms of thickness, however, percentage of the resistance of the substrate in view of the resistance of the power MOS chip would increase as working voltage of the power MOS chip is decreased. For example, the resistance of the substrate ranges from 3 percents to 5 percents of the resistance of the power MOS chip with 600V working volts. Meanwhile, for the power MOS with less than 30V working voltage, the resistance of the substrate would be increased to 15 percents to 30 percents of the power MOS chip. A traditional method of decreasing the resistance of the substrate is to grind the power MOS chips from 300 μm to 50 μm, as shown in FIG. 2. FIG. 2 shows the structure of the vertical power MOS with grinded substrate. The power MOS chips with the grinded substrates are so thin and subject to being broken frequently during subsequent semiconductor packaging process. In order to protect such thin chips, extra process and equipment become necessary. It results in significant increase in cost. Such thin chips are likely associated with the micro crack, which cause significant reduction in life-time of the usage. Therefore, how to improve the power semiconductor with low Rds(ON) effectively, and to cut down the associated cost, as well as to minimize the likelihood of the micro crack on chip have been important issues.

Accordingly, the invention provides a semiconductor structure with low drain-source on-resistance (Low Rds (ON)) in order to overcome the disadvantages of the related art.

SUMMARY OF THE INVENTION

The object of the present invention is to decrease the resistance between drain and source by using through silicon via (TSV) technology, in order to decrease the power consumption during operation of the power semiconductor.

In order to achieve the aforementioned objects, according to an embodiment of the present invention, a semiconductor structure is disclosed. The semiconductor structure includes a semiconductor unit, a first conductive structure, a first conductive plug, and a second conductive structure. The semiconductor unit has a substrate on a side of the semiconductor unit. The substrate has at least a hole. The first conductive plug is in the hole and the hole may be full of the first conductive plug or not entirely filled by the first conductive plug. A first conductive structure is on the surface of the side of the semiconductor unit. A second conductive structure is on a surface different from the surface where the substrate of the semiconductor unit is on. The embodiment replaces the original substrate which has high resistance with the first conductive plug which has low resistance, therefore effectively reducing the resistance of the substrate (Rds(ON)), and the power consumption of the operation of the semiconductor structure. Besides, when the semiconductor structure is in operation, the heat generated within the semiconductor structure may be transmitted to an outside conductive plug by the first conductive plug, so that the heat may be properly dissipated as well. Accordingly, the semiconductor structure according to the embodiment of the present invention may be associated with longer life-time and lower power consumption.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1:
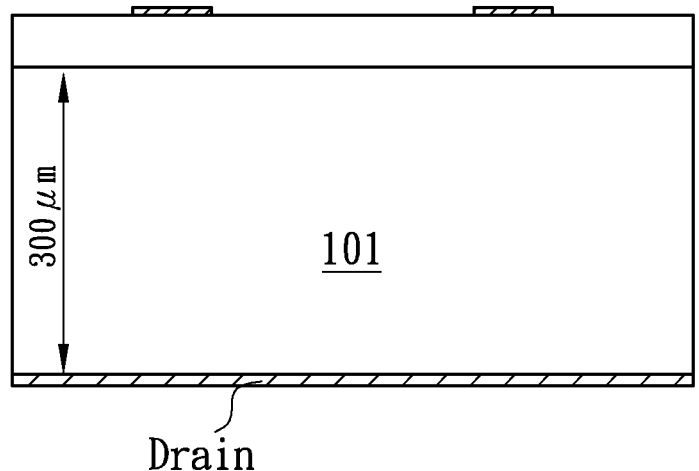
FIG. 1 shows a cross-section diagram of a traditional vertical MOS structure of a related art.
Figure 2:
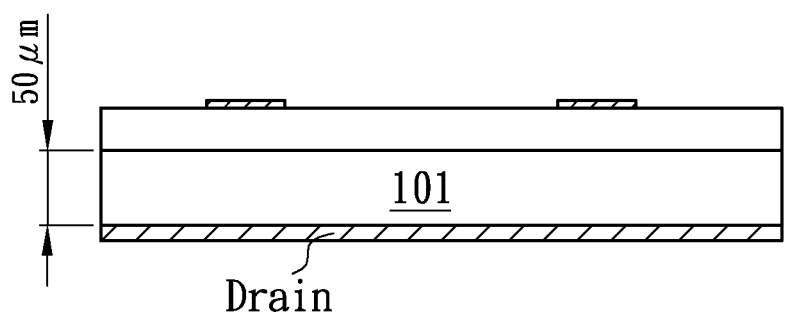
FIG. 2 shows a cross-section diagram of a vertical MOS structure with grinded substrate of a related art.
Figure 3A:
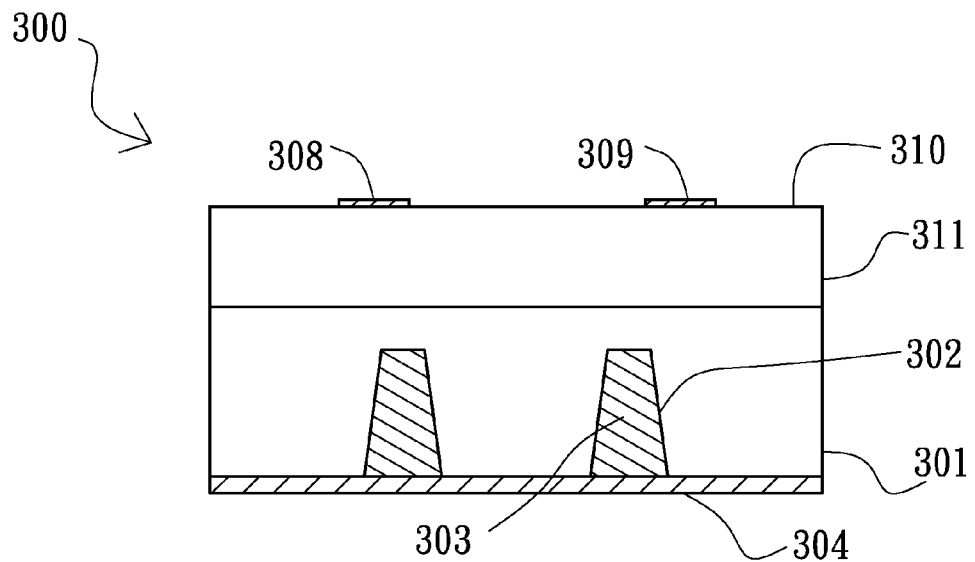
FIG. 3A shows a cross-sectional diagram of a semiconductor structure with low power consumption according to a first embodiment of the present invention.

FIG. 3A shows a cross-sectional diagram of a semiconductor structure with low power consumption according to a first embodiment of the present invention. As shown in FIG. 3A, a semiconductor unit 300 has a substrate 301, and at least one hole 302 formed within the substrate 301. The hole 302 may be implemented by a method of through silicon via (TSV). A conductive plug 303 may be present in the hole 302, a conductive structure 304 is on the surface of the substrate 301 and the conductive plug 303. The conductive structure 304 may function as a drain electrode of the semiconductor. A source electrode 308 and a gate electrode 309 are disposed on the surface 310 of the semiconductor unit 300. Benefit of decreasing the resistance of the semiconductor unit 300 can be achieved by replacing the substrate 301 which has higher resistance with the conductive structure 304, which may entirely or partially fill the hole 302.

Figure 3B:
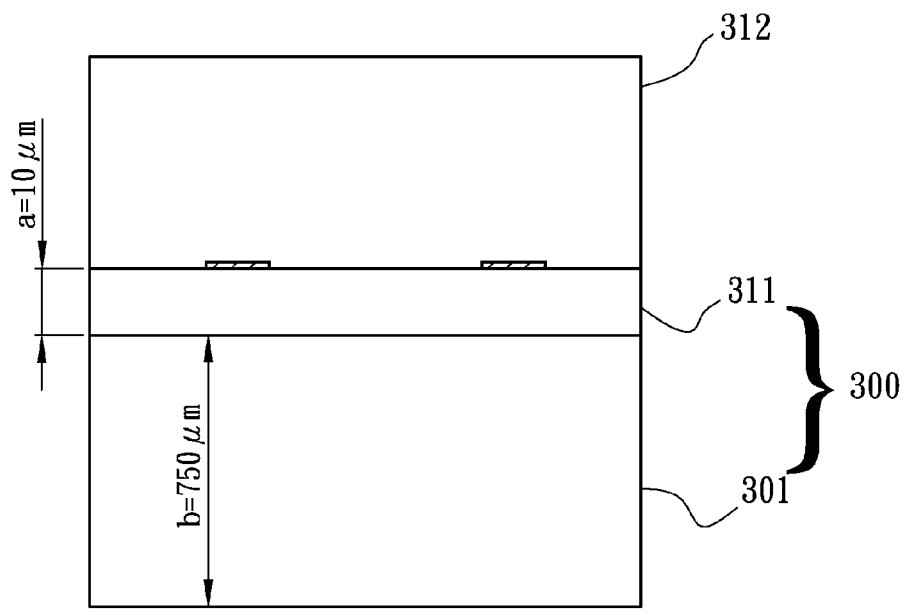
FIG. 3B to 3C show cross-sectional diagrams of a semiconductor structure with low power consumption under processing according to a first embodiment of the present invention.
Figure 3C:
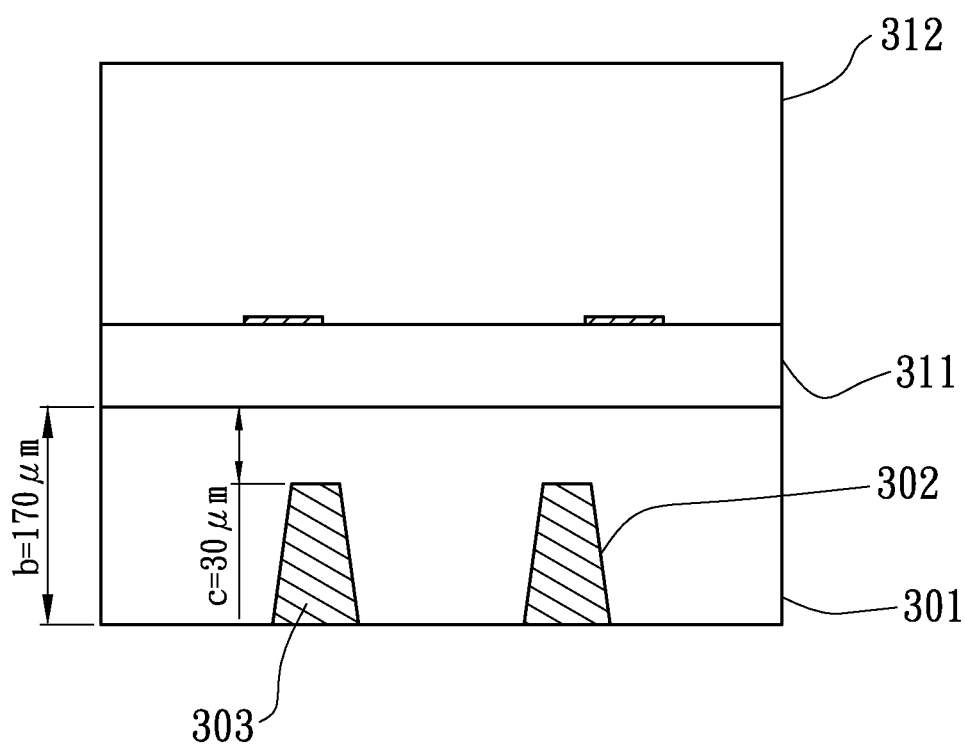

FIG. 3B to 3C show cross-sectional diagrams of a semiconductor structure with low power consumption under processing according to a first embodiment of the present invention. As shown in FIG. 3B, the semiconductor unit 300 which has a semiconductor epitaxial layer 311 and the substrate 301 is provided, and the semiconductor unit 300 is fixed upon a wafer carrier 312. Then, the substrate 301 of the semiconductor unit 300 may be grinded. The thickness of the semiconductor epitaxial layer 311 is about 10 micro-meters (um), and the thickness b of the substrate 301 is about 750 um. In order to describe the invention clearly, the figures are not fit to scale, and the dimensions are noted in the figures. As shown in FIG. 3C, the thickness b of the substrate 301 may be grinded to 170 um, after that a patterned photo-resist is applied to the substrate 301 so as to define a relative position of the hole 302 of the substrate 301. Then, the STV approach is utilized to etch away the corresponding part of the substrate 301 to form the hole 302. The distance c between the bottom of the hole 302 and the semiconductor epitaxial layer 311 is about 30 um. In addition, the conductive plug 303 may be deposited into the hole 302. The shape of the hole 302 may vary due to different process of different STVs, and the shape of the hole is not restricted to the shape shown in the figures of the embodiments of the present invention. The distance c between the bottom of the hole 302 and the epitaxial layer 311 may be zero in another implementation. Finally, as shown in FIG. 3A, a wafer carrier (not shown in the figure) is removed, and the conductive structure 304 may be further deposited on the surface of the substrate 301 and the conductive plug 303.

Figure 4A:
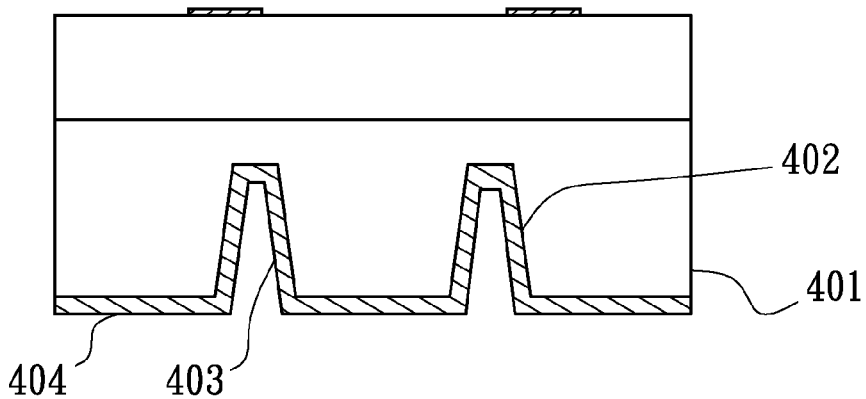
FIG. 4A shows a cross-sectional diagram of a semiconductor structure with low power consumption according to a second embodiment of the present invention.

FIG. 4A shows a cross-sectional diagram of a semiconductor structure with low power consumption according to a second embodiment of the present invention. Different form the first embodiment, a conductive plug 403 and a conductive structure 404 may be of the same conductive plug so that the conductive plug 403 and the conductive structure 404 may be prepared in the same manufacturing step. Thereafter, a conductive plug 403 may be deposited on the surface of the substrate 401 and may fill the hole 402 after removal of the photoresist (not shown in the figure) and the wafer carrier (not shown in the figure). And it is worth noting that whether the conductive plug 403 entirely fills the hole 402 or not may be dictated by the deposition time of the conductive plug 403. The mentioned conductive plug may be a metal alloy—TiNiAg or pure copper which is formed by evaporation.

Figure 4B:
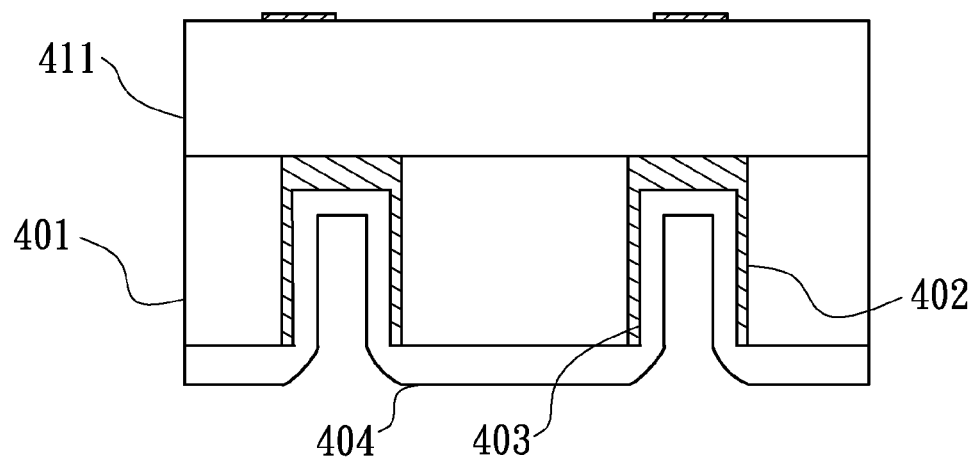
FIG. 4B shows a cross-sectional diagram of a semiconductor structure with low power consumption according to a third embodiment of the present invention.

FIG. 4B shows a cross-sectional diagram of a semiconductor structure with low power consumption according to a third embodiment of the present invention. The difference between the second embodiment and the third embodiment is the form of the conductive plug and the conductive structure in the hole. More specifically, the conductive plug 403 may be present in the hole 402 while the conductive structure 404 may be on the surface of the substrate 401 and the conductive plug 403. As such, the hole may be prepared before the conductive plug 403 so that the conductive plug 403 may fill the hole. The conductive structure 404 may be prepared after the conductive plug 403 filling the hole. In short, the conductive plug 403 and the conductive structure 404 may not be prepared in the same manufacturing process in the embodiment shown in FIG. 4B. The conductive plug 404 may be copper with thickness larger than 5 um. The conductive plug 403 may be Titanium with thickness about 0.15 um, and the Titanium layer may be used to prevent the copper from diffusing to the semiconductor epitaxial layer 411. Although the Titanium layer needs not to entirely fill the hole 402, in one implementation the Titanium layer may cover the entire surface of the semiconductor epitaxial layer 411 partially exposed in the hole 402.

Figure 5:
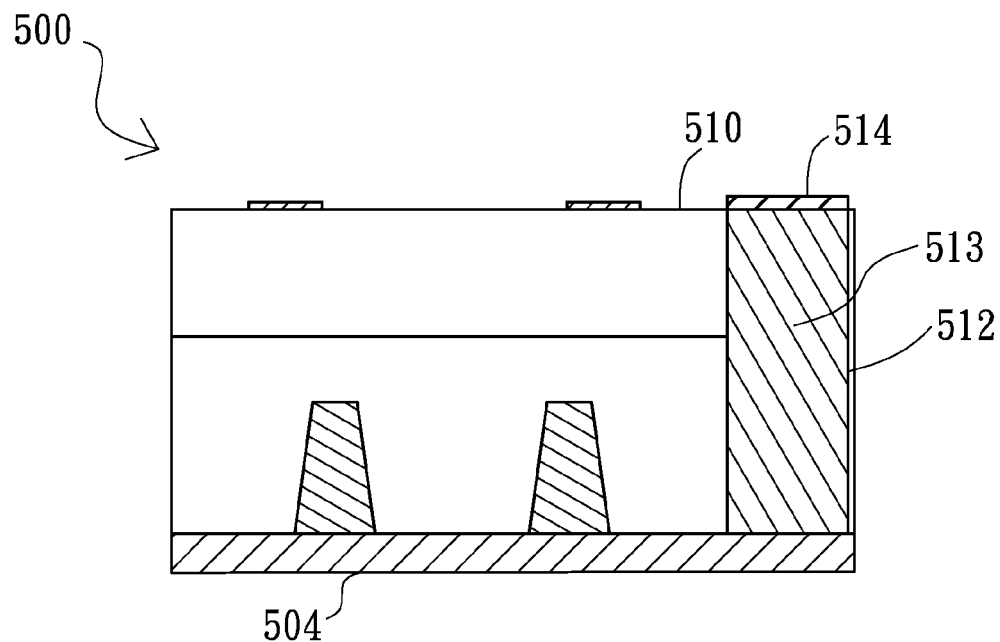
FIG. 5 shows a cross-sectional diagram of a semiconductor structure with low power consumption according to a fourth embodiment of the present invention.

FIG. 5 shows a cross-sectional diagram of a semiconductor structure 500 with low power consumption according to a fourth embodiment of the present invention. The difference between the first embodiment and the fourth embodiment lies in a through hole 512. As shown in FIG. 5, the through hole 512 is in the semiconductor unit 500 and is with the conductive plug 513 therein. And the conductive plug 513 is connected to a conductive structure 504 through the through hole 512. A drain electrode 514 is disposed on the conductive plug 513 and coupled to the conductive structure 504 through the conductive plug 513. The drain electrode 514 may not be necessary while the conductive plug 513 may serve as a drain. The drain electrode 514 may be partially or totally placed on the surface 510 of the semiconductor unit 500 so long as the drain electrode 514 may be in electrical coupling with the conductive plug 513. As such, area of the drain electrode 514 is not restricted to the figure and may accommodate to a variety of the circuit design. The through hole 512 may be implemented by the method of TSV, and the conductive plug 513, the drain electrode 514, and the conductive structure 504 may be the same metal.

Figure 6:
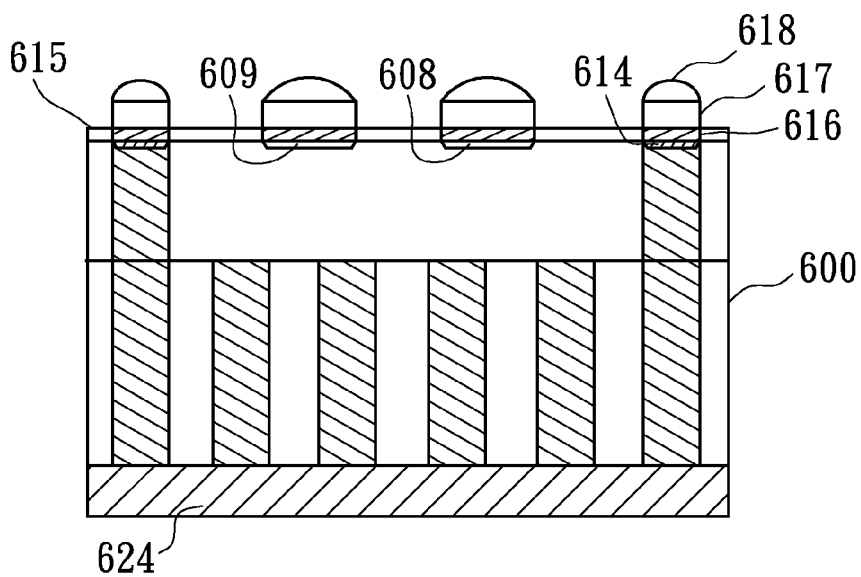
FIG. 6 shows a cross-sectional diagram of a packaging structure of a semiconductor structure with low power consumption according to a fourth embodiment of the present invention.

FIG. 6 shows a cross-sectional diagram of a semiconductor structure 600 with low power consumption according to a fifth embodiment of the present invention. The method of chip scale package (CSP) is used to package the semiconductor structure which is obtained by the method of TSV. A chip scale package comprises a protective layer 615 to isolate the semiconductor unit 600 from outside environmental contaminants such as oxygen or humidity. The protective layer 615 may also be used for electrical insulation. An under bump metallurgies 616 are disposed on a drain electrode 614, a source electrode 608, and a gate electrode 609. A copper rod 617 is disposed on the under bump metallurgy 616, and a solder bump 618 is disposed on the copper rod 617. A conductive structure 624, meanwhile, may be placed at the bottom of the package structure. The conductive structure 624 may be copper with thickness larger than 5 um and serve to dissipate heat inside the package structure to outside environment. An insulator layer (not shown) may be added to cover the conductive structure 624 in order to prevent the short circuit. At the same time, a heat sink may also be added on the package structure to help the heat dissipation and to decrease the temperature of the semiconductor unit 600 when the semiconductor unit 600 is in operation.

Figure 7A:
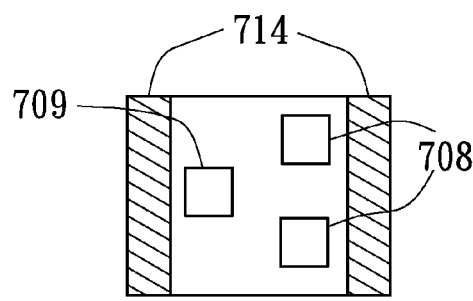
FIG. 7A to 7D show diagrams of the arrangement of the positions of drain electrode, source electrode, and gate electrode of a packaging structure according to the embodiment of the present invention shown in FIG. 6.
Figure 7B:
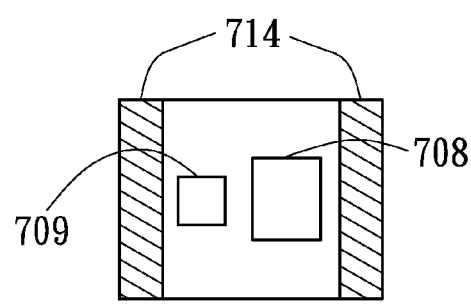
Figure 7C:
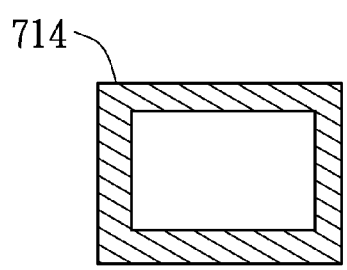
Figure 7D:
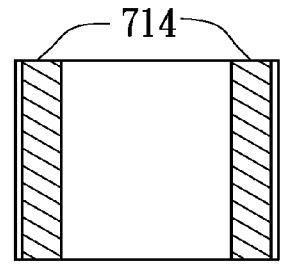

FIG. 7A to 7D show diagrams of the arrangement of the positions of drain electrode, source electrode, and gate electrode of a packaging structure according to the embodiment of the present invention shown in FIG. 6. As shown in FIG. 7A, drain electrodes 714 may be located at two sides of the packaging structure having a source electrode 708 and a gate electrode 709 placed inside of a region defined by the drain electrodes 714. The gate electrode 709 may be a single element, and the number of the source electrodes 708 may be two for large-current applications. As shown in FIG. 7B, the drain electrodes 714 may be still at the two sides of the predetermined region with a single source electrode 708 and a single gate electrode 709, which may be smaller in size than the source electrode 708. The drain electrode 714 may be at only one side of the predetermined region. As shown in FIG. 7C, it is worth noting that the drain electrode 714 may be adapted to surround the whole packaging structure (or the predetermined region) with positions of the drain electrode and the gate electrode remaining unchanged as those shown in FIG. 7A or FIG. 7B. As shown in FIG. 7D, the drain electrode may be placed at positions that are a predetermined distance from edges of the packaging structure.

Figure 8:
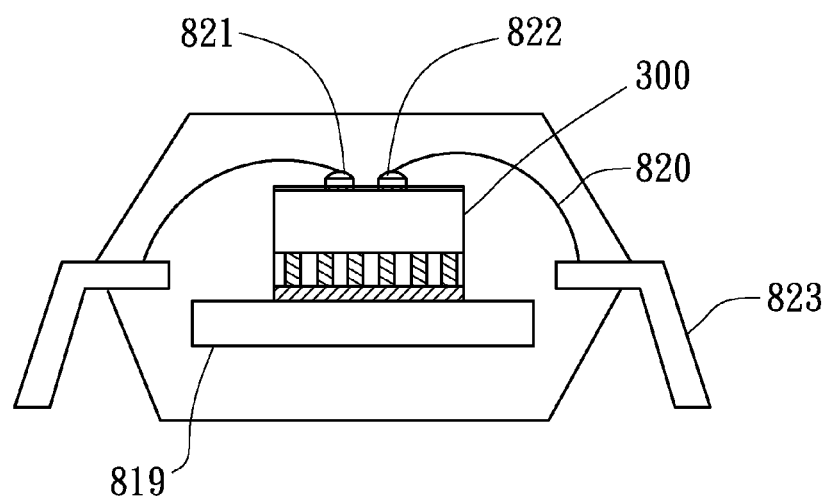
FIG. 8 shows a perspective diagram of a packaging structure of a semiconductor structure with low power consumption according to a first, a second, and a third embodiment of the present invention.

FIG. 8 shows a perspective diagram of a packaging structure of a semiconductor structure with low power consumption according to the first, the second, and the third embodiment of the present invention. More specifically, a traditional method of packaging is used to package the semiconductor unit 300, which is prepared by the method of TSV. The packaged semiconductor unit may be fixed to a lead frame 819 by silver paste. A source electrode 821 and a gate electrode 822 are connected to a pin 823 of the packaging structure through a bonding wire 820.

Figure 9:
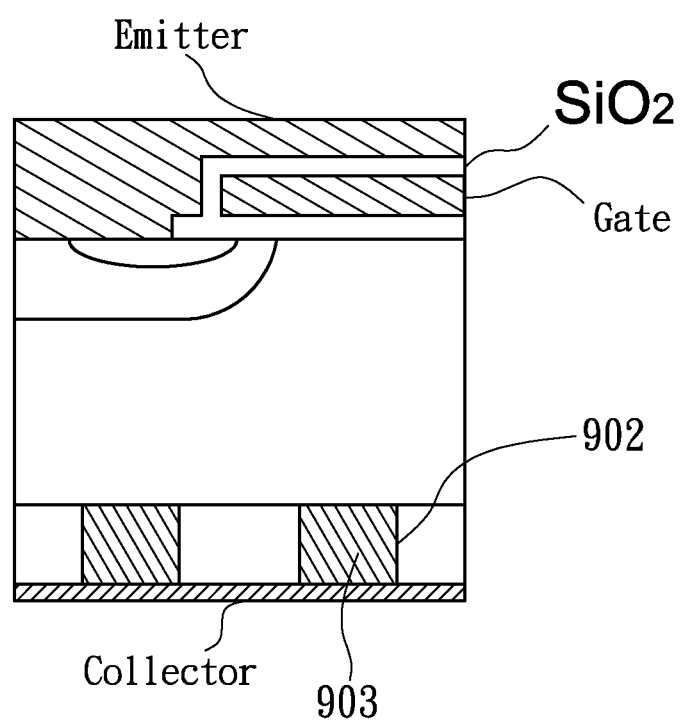
FIG. 9 shows a cross-sectional diagram of an insulated gate bipolar transistor to which the present invention is applied.

The semiconductor structure with low power consumption of the present invention generally utilizes the low resistance conductive plug to replace the original substrate of higher resistance. The resistance of the substrate is thus effectively reduced, causing the semiconductor structure in its entirety to consume less power. Besides, the heat generated in the semiconductor structure may be transmitted to the outside conductive plug or the lead frame through the conductive plug in the substrate when the semiconductor is in operation. Accordingly, the heat generated may be properly dissipated, prolonging life-time of the semiconductor structure and reducing the power consumption thereof. The semiconductor structure of the present invention may be applied to semiconductor and integrated circuit for other functionality with two or more electrodes. As shown in FIG. 9, an insulated gate bipolar transistor is depicted in which a hole 902 on the substrate may be formed before conductive plug 903 may be filled into the hole 902.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A semiconductor structure comprising:
   a semiconductor unit, having a substrate on a first side thereof, and the substrate having at least two through holes;
   a conductive structure located on a surface of the first side of the semiconductor unit;
   at least two first conductive plugs located in the two through holes of the substrate and coupled to the first conductive structure;
   at least a source electrode conductive structure located on a second surface of the semiconductor unit, wherein the second surface is located opposite to the first side;
   at least a gate electrode located on the second surface of the semiconductor unit;
   two drain electrodes located on the second surface of the semiconductor unit and the source electrode conductive structure and the gate electrode are located between the drain electrodes;
   at least a through hole in the substrate;
   at least a second conductive plug, located in the through hole to electrically connect the first conductive structure and one of the drain electrodes,
   a protecting layer disposed on the second surface of the semiconductor unit, exposing the top surface of the source electrode, the gate electrode, and the drain electrodes;
   at least a under bump metallurgy disposed on the source electrode, the gate electrode, and the drain electrodes;
   at least a copper rod disposed on the under bump metallurgy; and
   at least a solder bump disposed on the copper rod.

2. The semiconductor structure according to claim 1, wherein the semiconductor unit is a metal-oxide semiconductor field-effect transistor (MOSFET) device.

3. The semiconductor structure according to claim 1, wherein the hole of the substrate is made by the method of through silicon via (TSV).

4. The semiconductor structure according to claim 1, wherein the semiconductor unit is packaged by the method of chip scale package (CSP) in order to form a package structure.

5. The semiconductor structure according to claim 1, further comprising a heat sink module disposed on the package structure.

6. The semiconductor structure according to claim 5, wherein the number of the source electrode is two and the number of the gate electrode is one.

7. The semiconductor structure according to claim 5, wherein the number of the source electrode is one and the number of the gate electrode is one.

8. The semiconductor structure according to claim 1, wherein the first conductive plug and the second conductive plug are of the same material.

9. The semiconductor structure according to claim 1, wherein four drain electrode locate at four sides of the packaging structure to define a surrounding region and the source electrode and gate electrode place inside of the surrounding region.

10. The semiconductor structure according to claim 1, wherein the number of the source electrode is two and the number of the gate electrode is one.

11. The semiconductor structure according to claim 1, wherein the number of the source electrode is one and the number of the gate electrode is one.

12. The semiconductor structure according to claim 1, wherein the protecting layer and the under bump metallurgy are on the second surface of the semiconductor unit.

* * * * *